(12) United States Patent
Ma et al.

(10) Patent No.: US 7,029,373 B2
(45) Date of Patent: Apr. 18, 2006

(54) CHEMICAL MECHANICAL POLISHING COMPOSITIONS FOR METAL AND ASSOCIATED MATERIALS AND METHOD OF USING SAME

(75) Inventors: Ying Ma, Weatherford, TX (US); William Wojtczak, Austin, TX (US); Cary Regulski, Sugar Hill, GA (US); Thomas H. Baum, New Fairfield, CT (US); David D. Bernhard, Newtown, CT (US); Deepak Verma, Scottsdale, AZ (US)

(73) Assignee: Advanced Technology Materials, Inc., Danbury, CT (US)

( * ) Notice: Subject to any disclaimer, the term of this patent is extended or adjusted under 35 U.S.C. 154(b) by 185 days.

(21) Appl. No.: 09/929,564

(22) Filed: Aug. 14, 2001

(65) Prior Publication Data
US 2003/0073386 A1 Apr. 17, 2003

(51) Int. Cl.
B24B 1/00 (2006.01)

(52) U.S. Cl. .............................. 451/36; 51/307; 51/308; 51/309; 438/693

(58) Field of Classification Search ................. 451/36, 451/41, 63, 285, 287, 288; 51/306, 307, 308, 51/309; 438/692, 693; 156/345.11, 345.12
See application file for complete search history.

(56) References Cited

U.S. PATENT DOCUMENTS 6,375,545 B1 * 4/2002 Yano et al. .................... 451/36
6,443,812 B1    9/2002 Costas et al.
6,454,819 B1 * 9/2002 Yano et al. .................... 51/298
6,527,818 B1 * 3/2003 Hattori et al. ................. 51/305

FOREIGN PATENT DOCUMENTS

WO         01/02134        1/2001

OTHER PUBLICATIONS

Jianfeng Luo, et al. "Integrated Model for Chemical–Mechanical Polishing Based on A Comprehensive Material Removal Model", Sixth International Conference on Chemical–Mechanical Polish (CMP) Planarization for ULSI Multilevel Interconnection (CMP–MIC), Santa Clara, CA USA Mar. 8–9, 2001.

Byron J. Palla, et al., "Stabilization of High Ionic Strength Slurries Using the Synergistic Effects of a Mixed Surfactant System", Journal of Colloid and Interface Science 223, 102–111 (2000).

* cited by examiner

Primary Examiner—Eileen P. Morgan
(74) Attorney, Agent, or Firm—Margaret Chappuis; Steven J. Bultquist; Yongzhi Yang

(57) ABSTRACT

A chemical mechanical polishing slurry composition and method for using the slurry composition for polishing copper, barrier material and dielectric material that comprises first and second-step slurries. The first-step slurry has a high removal rate on copper and a low removal rate on barrier material. The second-step slurry has a high removal rate on barrier material and a low removal rate on copper and dielectric material. The first slurry comprises at least an organic polymeric abrasive.

40 Claims, 6 Drawing Sheets

CHEMICAL MECHANICAL POLISHING COMPOSITIONS FOR METAL AND ASSOCIATED MATERIALS AND METHOD OF USING SAME

TECHNICAL FIELD OF THE INVENTION

The present invention relates generally to the chemical mechanical polishing of semiconductor devices systems and methods, and more particularly, to a formulation and method for use in polishing metal films in semiconductor interconnection processes.

BACKGROUND OF THE INVENTION

The present invention relates to a chemical mechanical polishing composition for surfaces of a semiconductor wafer, and more particularly, to a chemical mechanical polishing slurry and a method for using the slurry to remove and polish copper containing materials, barrier materials and dielectric materials layered on semiconductor wafer surfaces.

Semiconductor wafers are used to form integrated circuits. The semiconductor wafer typically includes a substrate, such as silicon, upon which dielectric materials, barrier materials, and metal conductors and interconnects are layered. These different materials have insulating, conductive or semi-conductive properties. Integrated circuits are formed by patterning regions into the substrate and depositing thereon multiple layers of dielectric material, barrier material, and metals.

In order to meet the higher speeds required in LSI, semiconductor manufacturers are looking to copper and its alloys as interconnect materials due to its decreased resistivity. Copper is also less vulnerable to electromigration than other metals such as aluminum and less likely to fracture under stress.

In conventional deposition, a layer of metal and a layer of a masking material called photoresist are deposited on a silicon wafer. Unwanted metal is then etched away with an appropriate chemical, leaving the desired pattern of wires or vias. Next, the spaces between the wires or vias are filled with silicon dioxide (an insulator), and finally the entire wafer surface is polished to remove excess insulator. In copper deposition the damascene method is used wherein an oxide layer is first deposited and the pattern of wires or vias is formed by etching the oxide. The metal is then deposited second.

As successive layers are deposited across previously patterned layers of an integrated circuit, elevational disparity or topography develops across the surface of each layer. If left unattended, the elevational disparities in each level of an integrated circuit can lead to various problems. For example, when dielectric, conductive, or semiconductive material is deposited over a topological surface having elevationally raised and recessed regions, step coverage problems may arise. Step coverage is defined as a measure of how well a film conforms over an underlying step and is expressed by the ratio of the minimum thickness of a film as it crosses a step to the nominal thickness of the film over horizontal regions.

Typically for copper technology, the layers that are removed and polished consist of a copper layer (about 1–1.5 µm thick) on top of a thin copper seed layer (about 0.05–0.15 µm thick). These copper layers are separated from the dielectric material surface by a layer of barrier material (about 50–300 Å thick).

In order to obtain the correct patterning, excess material used to form the layers on the substrate must be removed and or planarized. Further, to obtain efficient circuits, it is important to have a flat or planar semiconductor wafer surface. Thus, it is necessary to polish certain surfaces of a semiconductor wafer.

Chemical Mechanical Polishing or Planarization ("CMP") is a process in which material is removed from a surface of a semiconductor wafer, and the surface is polished (planarized) by coupling a physical process such as abrasion with a chemical process such as oxidation or chelation. In its most rudimentary form, CMP involves applying slurry, a solution of an abrasive and an active chemistry, to a silicon wafer or polishing pad that buffs the surface of a semiconductor wafer to achieve the removal, planarization, and polishing process.

One key to obtaining good uniformity across the wafer surface is by a polishing formulation that has the appropriate selectivity for the material(s) to be removed. Good slurry distribution and uniform distribution of mechanical force are also key to obtaining good planarity. If appropriate film removal selectivity is not maintained dishing of copper and/or erosion of the dielectric may occur. Dishing may occur when the copper and barrier removal rates are disparate or when the chemistry is too active for the metal interconnect layer. Erosion occurs when the local dielectric removal rate is much higher than the metal rate (see FIGS. 1–5).

Typical commercial CMP slurries used to remove overfill material and polish semiconductor wafer surfaces have a barrier material removal rate below 500 Å/min. Further, these slurries have a copper to barrier material removal rate selectivity of greater than 4:1. This disparity in removal rates during the removal and polishing of the barrier material results in significant dishing of copper on the surface of the semiconductor wafer and/or poor removal of the barrier material.

As a potential solution, copper CMP often employs a two-step slurry approach. The slurry used in the first step is typically used to remove and planarize bulk copper and as such has a high copper removal rate, (e.g. 4000 Å/min) and a comparatively low barrier material removal rate (e.g. 500 Å/min). The slurry used in the second step is used for the barrier breakthrough step and finishing and as such has a relatively high barrier material removal rate (e.g. 1000 Å/min), comparable or lower removal rate for copper and low removal rate on the dielectric material, (e.g. the rates for copper and dielectric (thermal oxide) should be lower than 500 Å/min).

Currently, commercially available copper slurries use particles such as fumed or precipitated silica or alumina as abrasives. These abrasives typically have large particle size distributions when suspended in the slurries. Particles of fumed alumina and silica have diameters around 700 nm and particle size distributions of >1 µm. Wide particle size distribution may significantly impact the planarization efficiency.

Fumed or precipitated silica or alumina may also agglomerate to form larger, dense, hard particles or agglomerated precipitates over time. (See U.S. Pat. No. 5,527,423 to Neville, et al.). This produces defects in the form of scratches, voids, defects or pits on the polished wafer surface.

Further, the abrasives are inorganic oxide particles that have high hardness. As a result, defects in the form of micro-scratches are produced on copper surfaces during and after polishing. The scratches occur due to the solid abrasive, in particular alumina, which is the main material used as a metal polishing abrasive. Slurry remains behind in the micro-scratches causing the semiconductor device to fail. Micro scratches and poor planarization efficiency result in integrated circuits with increased defects and a lower yield.

Current second step slurries suffer from a low selectivity of barrier to metal, the best selectivity being about 6 to 1, while the selectivity of barrier to dielectric is in the range of from about 2 to 27. (See U.S. Pat. No. 6,063,306 to Kaufman, et al.; U.S. Pat. No. 5,676,587 to Landers, et al.; U.S. Pat No. 6,001,730 to Farkas, et U.S. Pat. No. 6,242,351 to Li, et al.).

Therefore, it is one object of the present invention to provide an improved slurry composition using an abrasive having a moderate hardness to remove a softer metal oxide layer while keeping the harder barrier layer and thermal oxide layer relatively intact.

It is a further object of this invention to provide an improved two step slurry approach using a first polishing slurry having a high removal rate on metal and a high selectivity of metal to barrier and a second slurry also called a barrier break-through step having a high removal rate on barrier and a low to moderate removal rate on copper and dielectric.

It is a further object of the present invention to provide a stable first-step polishing slurry comprising an abrasive that does not agglomerate over time to form hard, dense sediment.

A still further object of the present invention is to provide a stable first-step polishing slurry comprising a moderately hard abrasive having a minimal particle size distribution.

These and other objects and advantages of the invention will be apparent to those skilled in the art upon reading the following detailed description and upon reference to the drawings.

SUMMARY OF THE INVENTION

The present invention is directed to a chemical mechanical polishing slurry comprising a first slurry, which has a high removal rate on copper and a low removal rate on barrier material and a second slurry, which has a high removal rate on barrier material and a low to moderate removal rate on copper and the associated dielectric material. The first slurry composition comprises at least a moderately hard organic polymeric abrasive, an oxidizing agent and an activating agent and the second slurry comprises at least a silica abrasive, an oxidizing agent and an activating agent. Also disclosed as the present invention, is a method for chemical mechanical polishing of copper, barrier material and dielectric material with the polishing slurry of the present invention. As will become apparent from the discussion that follows, the stable slurry and method of using the slurry provide for removal of material and polishing of semiconductor wafer surfaces with significantly no dishing, or oxide erosion, with significantly no surface defects and good planarization efficiency.

DETAILED DESCRIPTION OF THE INVENTION AND PREFERRED EMBODIMENTS THEREOF

The disclosure of the following United States patent application, which is commonly owned by the assignee of the present application is hereby incorporated herein by reference in its entirety:

U.S. patent application Ser. No. 09/562,298 filed on May 1, 2000 in the names of Thomas H. Baum, et al.

The present invention presents a novel, stable chemical-mechanical polishing (CMP) slurry that overcomes the deficiencies in the prior art while providing a manufacturable process that may be implemented in the semiconductor-manufacturing arena with little or no alterations to the current CMP systems and footprints. As will become apparent from the examples that follow, the stable CMP slurry and method of using such slurry provide for removal of material and polishing of semiconductor wafer surfaces with significantly improved defectivity including reduced dishing or oxide erosion, with significantly no surface defects and good planarization efficiency.

The present invention provides a chemical mechanical polishing slurry composition and method of using such slurry for removing and polishing the bulk copper layer of a damascene processing step in the manufacturing of an integrated circuit. Further, the following invention provides a two step CMP slurry comprising a first slurry formulation, which has a high removal rate on copper and a low removal rate on barrier material and a second slurry formulation that has a high removal rate on barrier material and a low to moderate removal rate on copper and the associated dielectric material.

Figure 1:
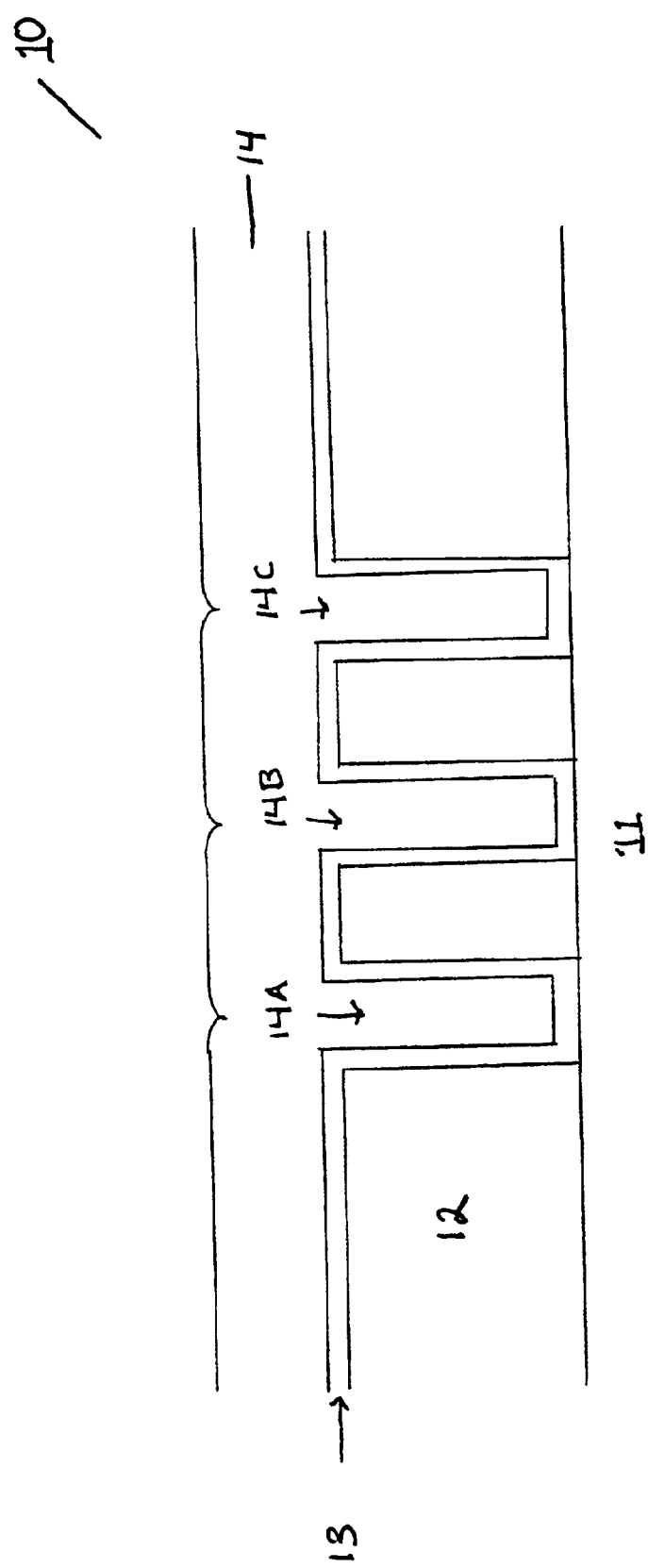
FIG. 1 is a cross-sectional view of a semiconductor wafer prior to chemical mechanical polishing.

FIG. 1 illustrates a semiconductor wafer 10 prior to CMP. As shown, substrate 11 may be made of any conventional semiconductor materials, including silicon, germanium or silicon-germanium. Layered on top of the substrate 11 is dielectric material 12, which is preferentially silicon oxide, low k dielectrics comprised substantially of silicon oxide, a carbon containing silicon oxide or a fluoride doped silicon glass (FSG). Layered on the dielectric material 12, is barrier material 13. The barrier material layer 13 is typically about 50 to 300 Å thick. The barrier material 13 may be any material conventionally used, but is typically chosen from the group of tungsten nitride, tantalum, tantalum nitride, titanium nitride, silicon doped tantalum nitride or silicon doped titanium nitride. Finally, a layer of copper 14 covers the barrier material layer 13, and extends into trenches 14a, 14b, and 14c. The copper layer 14 is usually about 1- to 1.5 µm thick and the copper layer 14 in FIG. 1 may include a thin copper seed layer, which is usually about 0.05–0.15 µm thick.

Figure 2:
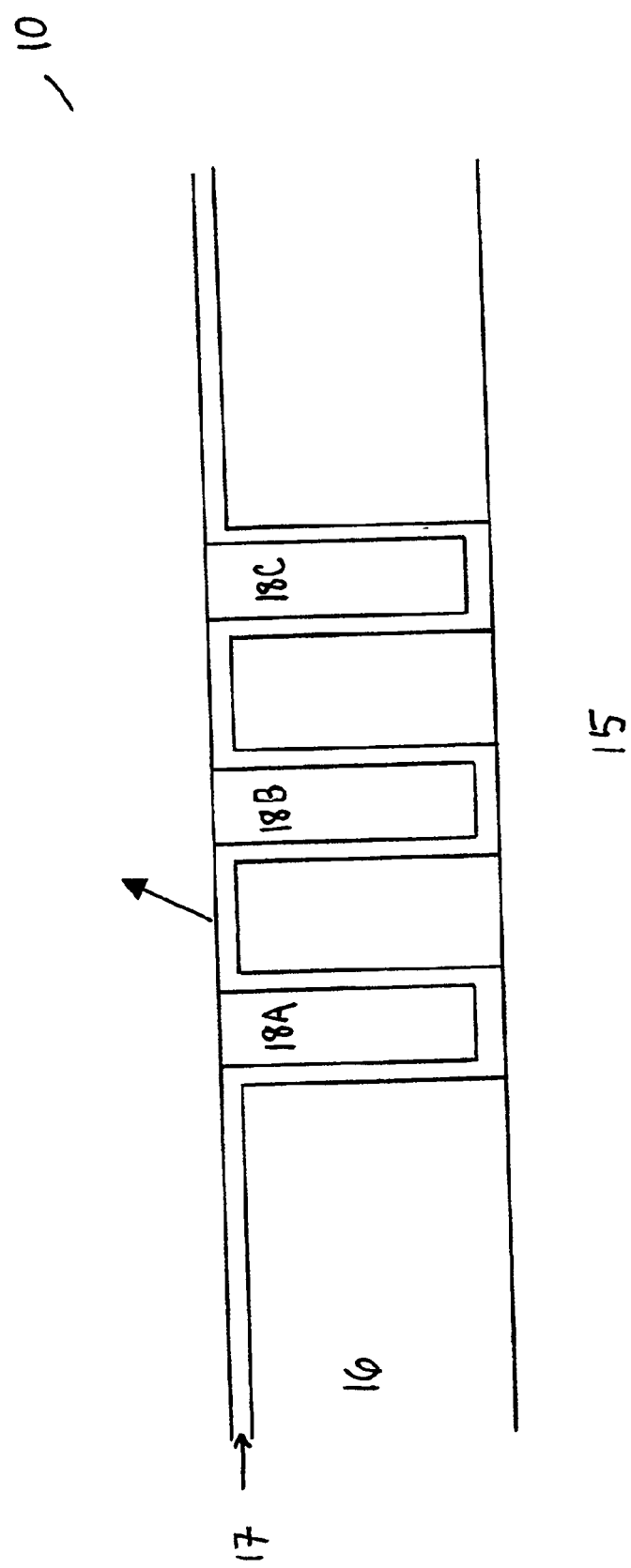
FIG. 2 is a cross sectional view of the semiconductor wafer of FIG. 1 following chemical mechanical polishing with the first slurry, according to one embodiment of the present invention.
Figure 3:
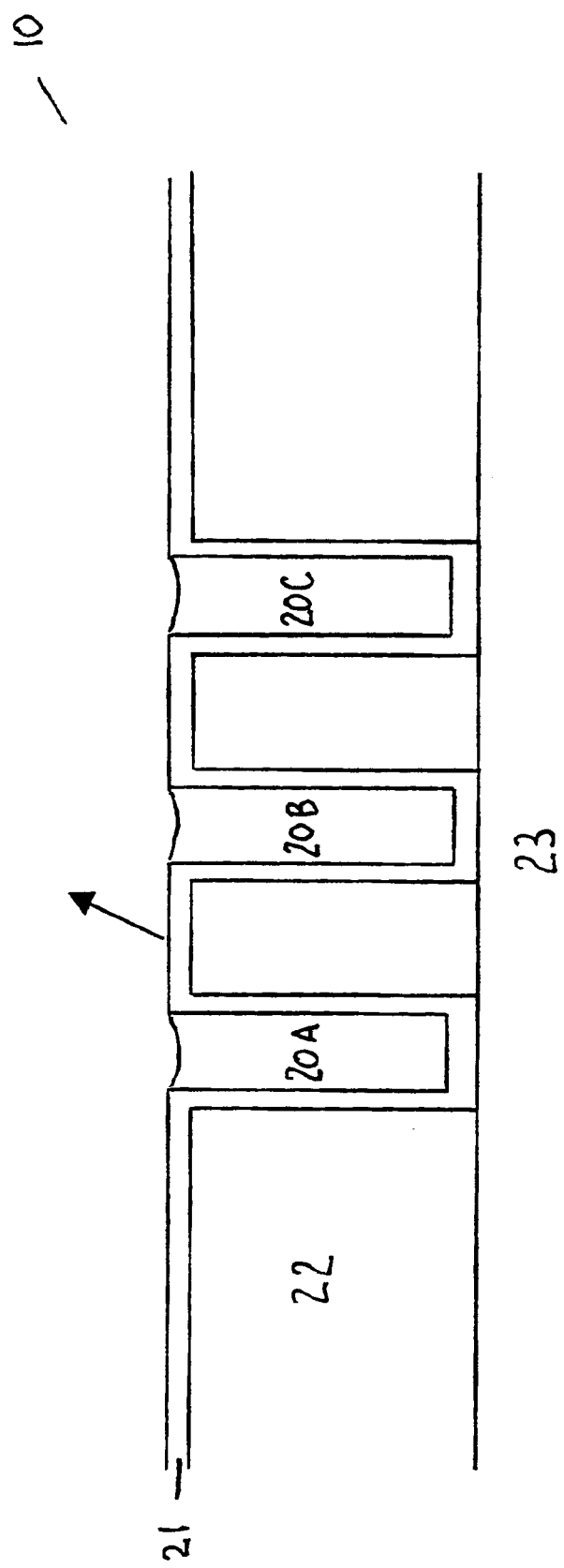
FIG. 3 is a cross sectional view of the semiconductor of FIG. 1 following chemical mechanical polishing with the first slurry, according to another embodiment of the present invention.

The invention is a CMP slurry designed to polish copper 14 and associated barrier materials 13 such as tungsten nitride, tantalum, tantalum nitride, silicon doped tantalum nitride, titanium nitride and silicon doped titanium nitride. The chemical mechanical polishing slurry of the present invention is comprised of two parts. The first slurry is a copper selective slurry formulation used to remove the bulk copper down to the barrier layer (FIG. 2). The first slurry has a high removal rate of copper and a low removal rate of barrier material. The second slurry formulation is selective to the barrier layer and removes the barrier material down to the dielectric material. The second slurry has a high removal rate of barrier and a low to moderate removal rate of copper and dielectric. (FIG. 3). The various removal rates of the first and second slurries on various materials are shown in Table 1. In this way, two slurries together comprise a combined package to polish copper metallization schemes for integrated circuit manufacturing.

steps (1) and (2) of the present method for CMP have been carried out, and the semiconductor wafer surface has been polished with the first slurry. When FIG. 2 is compared to FIG. 1, the top copper layer 14 in FIG. 1 has been preferentially removed, and only the copper in the trenches (FIG. 2) 18a, 18b, and 18c is left. As shown in FIG. 2 the barrier material layer 17 is substantially in tact, and the dielectric material 16 based on substrate 15 is still unexposed.

According to a further embodiment of the present invention, FIG. 3 illustrates the semiconductor wafer 10 of FIG. 1, after steps (1) and (2) of the present method for CMP have been carried out, and the semiconductor wafer surface has been over-polished with the first slurry in order to remove all the bulk copper on top of the barrier layer, while leaving the barrier layer relatively in tact. When FIG. 3 is compared to FIG. 1, the top copper layer 14 in FIG. 1 has

TABLE 1

Removal Rates of the First and Second Slurried on Different Materials*

| Layer | First Slurry Removal Rates (Å/min) | Selectivity First Step Cu to Material | Second Slurry Removal Rates (Å/min) | Selectivity Second Step Ta to Material |
|---|---|---|---|---|
| Copper | 4100 | — | 1 | 60:1 |
| Tantalum | <8.2 | >500 | 60 | — |
| Tantalum Nitride | <8.2 | >500 | 81 | — |
| Thermal Oxide | <8.2 | >500 | 31 | 2:1 |

*(For the first step, Down Force = 4 psi, Flow Rate = 160 mL/min, Table Speed = 125 rpm, Quill Speed = 116 rpm, Pad Type = IC 1000 Subpad: Suba IV, For the second step, Down force = 4 psi, Flow Rate = 160 mL/min, Table Speed = 45 rpm, Quill Speed = 42 rpm, Pad Type = IC 1000, Subpad: Suba IV)

Referring to FIG. 1, In one embodiment, the present invention includes a method for chemical mechanical polishing copper 14, barrier material 13 and dielectric material 12, comprising the following steps: (1) providing a first chemical mechanical polishing slurry comprising an organic polymeric abrasive, wherein said first slurry has a high removal rate on copper 14 and a low removal rate on barrier material 13; (2) chemical mechanical polishing a semiconductor wafer surface 10 with the first slurry; (3) providing a second chemical mechanical polishing slurry that has a high removal rate on barrier material 13 a low to moderate removal rate on copper 14 and a low to moderate removal rate on the dielectric material 12; and (4) chemical mechanical polishing the semiconductor wafer surface 10 with the second slurry.

Generally, the slurry is applied to a pad contained on a polishing instrument or directly dispensed onto the wafer to be processed. Polishing instrument parameters such as down force (DF), flow rate (FR), table speed (TS), quill speed (QS), and pad type can be adjusted to effect the results of the CMP slurry. Preferably the down force is in a range from about 3 to 10 psi, the flow rate is in a range of from about 120 to 200 mL/min, the table speed is in a range of from about 35 and 200 rpm, a quill speed in a range of from about 30 to 200 rpm, and an IC 1000 pad type.

The polishing pad serves as a means of applying mechanical friction and adhesion to the wafer surface. The optimum hardness of the pad is different depending on the object on which CMP is being performed. In the instant invention, a hard polishing pad is preferred, such as the type manufactured by Rodel, 3804 East Watkins Street, Phoenix, Ariz. 85034 and sold under the brand name IC 1000.

According to one embodiment of the present invention, FIG. 2 illustrates the semiconductor wafer 10 of FIG. 1, after been preferentially removed, and only the copper in the trenches (FIG. 3) 20a, 20b, and 20c is left. As shown in FIG. 3 the barrier material layer 21 is substantially in tact, and the dielectric material 22 based on substrate 23 is still unexposed.

Figure 4:
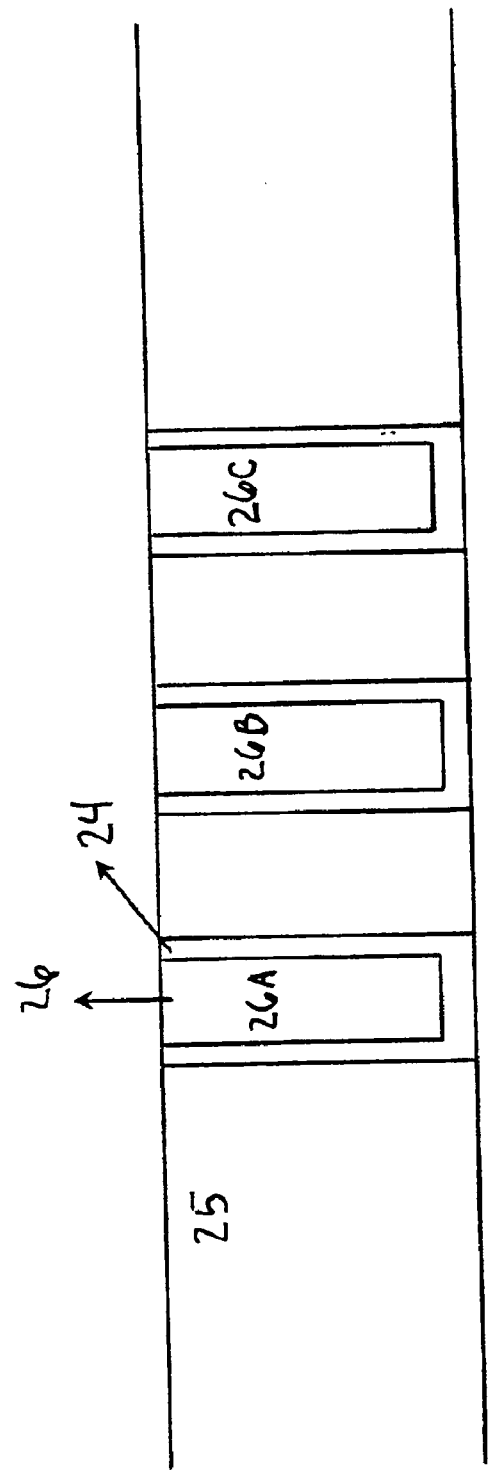
FIG. 4 is a cross sectional view of the semiconductor wafer of FIG. 2 following chemical mechanical polishing with the second slurry, according to the present invention.

Similarly, FIG. 4 illustrates the semiconductor wafer 10 of FIGS. 1 and 2 and 3, after steps (3) and (4) of the present method for CMP have been carried out, and the semiconductor wafer surface has been polished with the second slurry. As shown in FIG. 4, the barrier material layer 24 has been removed down to the dielectric material 25. The second slurry also removed just enough of the copper in trenches 26a, 26b, and 26c so that the surface of the semiconductor wafer 10 is flat and planar. The second slurry also serves to polish the newly exposed surface, including the dielectric material 25, the barrier material 24a, 24b, 24c, and the copper 26a, 26b, 26c. All of these materials are based on substrate 27.

Figure 5:
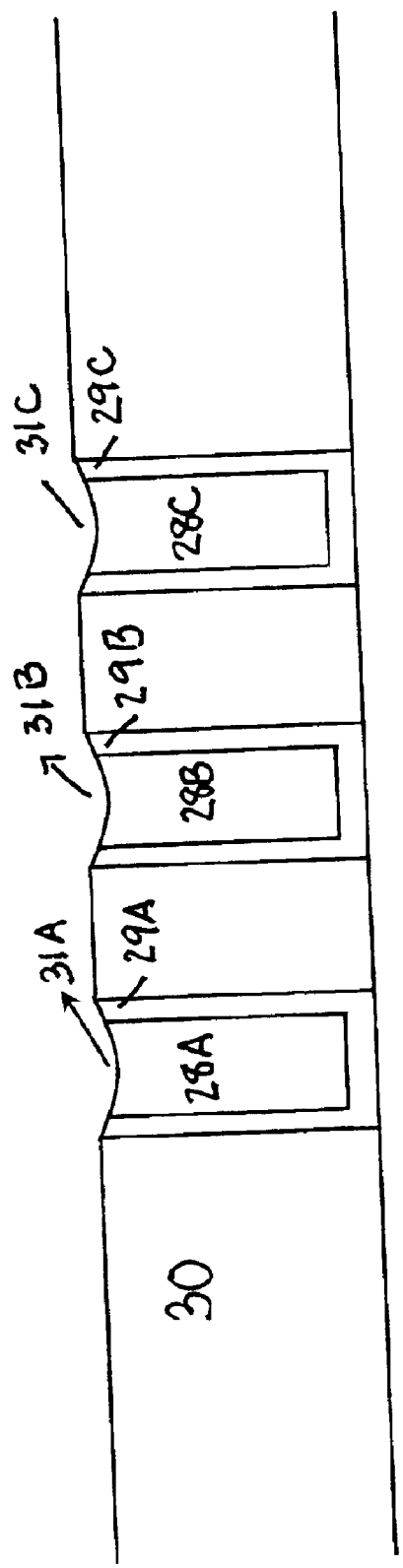
FIG. 5 is a cross sectional view of a semiconductor wafer illustrating copper dishing.

By using the first and second step slurry compositions of the claimed invention, with the selectivities described in Table 1, and following the described method, copper dishing (FIG. 5) and oxide erosion (FIG. 6) can be minimized. FIG. 5 shows a semiconductor wafer to which a CMP slurry has been applied, which had a higher selectivity for copper 28a, 28b, 28c than for the barrier material 29a, 29b, H 29c or dielectric material 30. As a result, disparate amounts of copper are removed from the surface of the semiconductor wafer. This is known as copper dishing and is shown by the dish-like troughs 31a, 31b, and 31c in the trenches of copper 28a, 28b, 28c. The CMP slurry of the present invention and method of using this slurry greatly reduces copper dishing.

Figure 6:
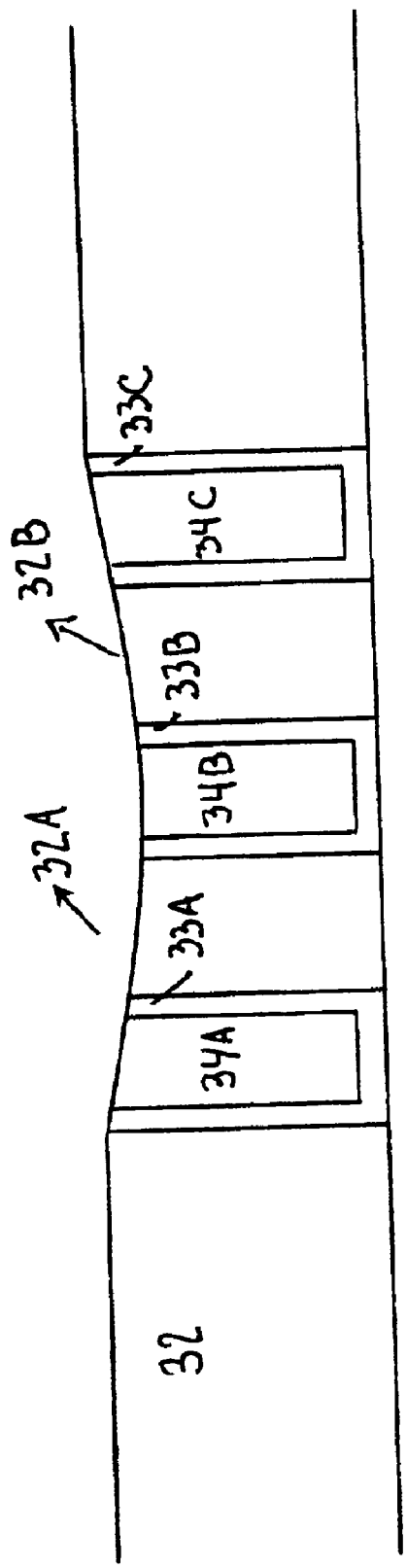
FIG. 6 is a cross sectional view of a semiconductor wafer illustrating oxide erosion.

Similarly, FIG. 6 shows a semiconductor wafer to which a CMP slurry has been applied, which has a higher selectivity for the dielectric material 32 than for the barrier material 33a, 33b, 33c, or copper 34a, 34b, 34c. As a result, disparate amounts of dielectric material are removed from the surface of the semiconductor wafer. This is known as oxide erosion and is shown by the indentions and/or reduction of the dielectric material 32a, 32b. The CMP slurry of the present invention and method of using this slurry greatly reduces oxide erosion.

The present invention provides a novel first-step slurry polishing composition comprising an organic polymeric abrasive having little or no agglomeration over time.

International patent PCT/US00/17046 teaches that agglomeration of abrasive particles occurs in two stages. Stage 1 agglomeration involves agglomerated particles held together primarily by van der Waals forces. Stage 2 agglomeration can occur after stage 1 agglomeration, wherein the particles then fuse together over time, causing the particles to be primarily held together not by van der Waals forces, but rather by covalent (or similar-type high energy) bonding between the particles. The present first step slurry formulation avoids stage 1 and stage 2 agglomeration.

In one embodiment, the present invention provides a CMP slurry comprising a first step slurry composition useful for removal, planarization and polishing of metal layers from a semiconductor substrate. The composition comprises a novel organic polymeric abrasive that is moderately hard and does not agglomerate in the formulation over time or during use. The moderately hard nature of the polymeric abrasive provides for the removal of the softer copper layer while keeping the harder barrier and thermal oxide layer relatively intact.

The abrasive component of the first step slurry may comprise any polymeric material that is sufficiently hard to abrade copper oxide, in any shape or form that sufficiently abrades the metal and/or metal oxide layer from the substrate surface. Specific examples of polymeric materials useful as abrasive components include but are not limited to poly (styrenes), poly (ethers), poly (siloxanes), poly (vinyl acetates), poly (vinyl alcohols), poly (vinylbenzenes), and substituted versions and mixtures thereof. Colloidal solutions of these polymer solutions are available from Polysciences, Polymer Systems AS, and Microparticles GmbH. Raw materials to manufacture these particles are widely commercially available in the paper industry as paper surface sizing agents.

In a preferred embodiment, the CMP slurry comprises a first slurry polishing formulation useful for removal and polishing of copper containing materials from a semiconductor substrate, wherein the formulation comprises poly (methyl methacrylate) as the abrasive. Preferably, the poly (methyl methacrylate) particles have a particle size distribution in the range of from about 3 to 100 nm, more preferably from about 15 to 80 nm and most preferably from about 30 to 60 nm. Preferably the mean particle size distribution of the poly (methyl methacrylate) particles is in a range of from about 20 to 80 nm, more preferably from about 30 to 60 nm and most preferably the mean particles size is between about 40 and 45 nm. Preferably the specific gravity of the particles is between 1 and 1.5 g/mL.

The poly (methyl methacrylate) or other polymeric abrasive particles of the present invention have an aggregate size distribution of less than 1.0 micron and an average or mean aggregate diameter of less than about 45 nm. These abrasive particles have a much milder hardness compared to alumina and silica abrasives.

The first step slurry, thus, can employ polymeric constituents as the abrasive particles in the size range of 3 to 100 nm. These particles coupled with the step 1 formulation chemistry described below, allow the first-step slurry to achieve a high copper removal rate but a minimal barrier material removal rate. Poly (methyl methacrylate), with a narrow size distribution, minimizes micro scratch defects and provides superior removal rates on copper materials, greater than about 1000 Å/min, more preferably greater than about 2000 Å/min and most preferably greater than about 4000 Å/min and low removal rates for barrier and dielectric. Further, such abrasives with a mean size of less than about 45 nm provide very good planarization efficiency without increased defectivity.

In a further embodiment the CMP slurry comprises a first step slurry polishing formulation for removing a copper containing layer from a substrate, said formulation comprising a polymeric abrasive, oxidizing agent and activating agent. Preferably the formulation has a pH in a range of from about 0.1 to 6.9, more preferably in the range from about 1 to 5 and most preferably, the pH of the polishing formulation is in the range of from about 2 to 4.8. The pH of the solution is critical to achieving acceptable removal rates.

As used herein, the term oxidizing agent is defined as any substance which removes metal electrons and raises the atomic valence and includes but is not limited to hydrogen peroxide ($H_2O_2$), ferric nitrate ($Fe(NO_3)_3$), potassium iodate ($KIO_3$), potassium permanganate ($KMnO_4$), nitric acid ($HNO_3$), ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), tetramethylammonium chlorite (($N(CH_3)_4$)$ClO_2$), tetramethylammonium chlorate (($N(CH_3)_4$)$ClO_3$), tetramethylammonium iodate (($N(CH_3)_4$)$IO_3$), tetramethylammonium perborate (($N(CH_3)_4$)$BO_3$), tetramethylammonium perchlorate (($N(CH_3)_4$)$ClO_4$), tetramethylammonium periodate (($N(CH_3)_4$)$IO_4$), tetramethylammonium persulfate (($N(CH_3)_4$)$S_2O_8$), urea hydrogen peroxide (($CO(NH_2)_2$) $H_2O_2$). The preferred oxidizing agen first-step slurry composition of the instant invention are hydrogen peroxide and iodate salts.

Alternatively, the oxidizing agent may comprise an amine-N-oxide having the formula ($R_1R_2R_3N \rightarrow O$), wherein $R_1R_2R_3$ are independently selected from the group consisting of: H and $C_1$–$C_8$ alkyl. Specific examples of amine-N-oxides include but are not limited to 4-methylmorpholine N-oxide ($C_5H_{11}NO_2$) and pyidine-N-oxide ($C_5H_5NO$).

Further, as used herein, the term activating agent is defined as any substance that in the presence of a water containing solution solubilizes or etches the oxidized copper material. Copper activating agents useful in the present invention include but are not limited to mineral acids (i.e. hydrochloric acid, nitric acid), inorganic acids (i.e. phosphoric acid) and organic acids (i.e. citric acid, acetic acid and maleic acid). Preferably the activating agent of the present first step slurry is citric acid.

In a further embodiment, the first step slurry composition of the present invention, may comprise, a polymeic abrasive, an oxidizing agent, an activating agent, a corrosion inhibitor and optionally a cleaning agent. Preferably the first-step slurry composition comprises from about 0.1 to 50 percent colloidal poly (methyl methacrylate), from about 0.1 to 25 percent oxidizing agent; from about 0 to 5 percent activating agent; from about 0 to 3 percent corrosion inhibitor and from about 0 to 3 percent cleaning agent. Preferably the pH of the first-step slurry composition is between about 0.1 to 6.9 and more preferably between about 1 to 5.

As used herein, a corrosion inhibitor is defined as a substance that reacts with the fresh copper surface and/or oxidized copper thin film to passivate the copper layer and prevent excessive etching of the copper surface during CMP. The first slurry of the present invention is sufficiently benign to the metal surface being polished to have a static metal etch rate of less than 500 Å, more preferably less than 200 Å, and most preferably less than 50 Å.

As used herein, a cleaning agent is defined as a substance that slowly etches, or chelates to the the copper, leading to soluble copper complexes that can be readily removed during polishing.

The corrosion inhibitor should be a carboxylic acid. More specifically, the carboxylic acid may be chosen from the group of glycine, oxalic acid, malonic acid, succinic acid and nitrilotriacetic acid. Alternatively, the carboxylic acid may be a dicarboxylic acid that preferentially has a nitrogen containing functional group. In the most preferred form, the corrosion inhibitor is iminodiacetic acid or benzotriazole.

The first step slurry formulation may further comprise potassium or ammonium hydroxide or other buffering agents in such amounts as to adjust the pH to the desired level.

In a preferred embodiment, the first step slurry formulation is an aqueous mixture comprising (by weight percentage) 5 percent poly (methyl methacrylate) as the abrasive or 12.5 percent colloidal poly (methyl methacrylate) as abrasive; 0.1 percent of citric acid as activating agent; and 0.2 percent iminodiacetic acid as passivating agent. Ammonium hydroxide was used to adjust the pH to the desired level.

The abrasive used in the preferred first-step slurry formulation of the present invention may be stabilized with a surfactant. The surfactant may be cationic or anionic. Preferably the surfactant is anionic. The surface charges that the surfactant imparts to the particles cause steric repulsion among the abrasive particles in order to keep the particles suspended in a colloidal state within the slurry composition.

Anionic surfactants are ionic compounds, with the anion being the surface-active portion. In the present invention the surfactant is selected from the group consisting of alkyl sulfates, carboxylates and alkyl phosphates having carbon backbones in the range of from C10 to C14. Preferably the surfactant is a sulfate. More prefereably the surfactant is sodium laurel sulfate.

By coating the abrasive particles with a surfactant or polyelectrolyte prior to incorporating the particles into a slurry system or after the particles are incorporated into a system, stage 2 agglomeration may be inhibited. The surfactant and/or polyelectrolyte will tend to remain in close proximity to the slurry particles, thereby sterically hindering the particles from coming sufficiently close to one another to enable stage 2 agglomeration.

During the damascene process, grooves are dry etched into an insulating thin film to form an interconnect pattern. Copper or copper alloy is deposited over the entire wafer surface, reflecting the groove which is the interconnect pattern. If left unattended, the elevational disparities in each level of an integrated circuit can lead to various problems. For example, when dielectric, conductive, or semiconductive material is deposited over a topological surface having elevationally raised and recessed regions, step coverage problems may arise. Step coverage is defined as a measure of how well a film conforms over an underlying step and is expressed by the ratio of the minimum thickness of a film as it crosses a step to the nominal thickness of the film over horizontal regions.

Although the organic polymeric abrasive particles of the present invention have been directed to poly (methyl methacrylate), it is understood that the teachings herein have applicability to other organic polymeric materials such as poly (styrenes), poly (ethers), poly (siloxanes), poly (vinyl acetates), poly (vinyl alcohols), poly (ethylenes), poly (imides), poly (vinylbenzenes), and substituted versions thereof. Further, the organic polymeric abrasive particles may be utilized to polish other metal surfaces such as tungsten, aluminum and titanium as well as under layers such as titanium, titanium nitride and alloys of titanium/tungsten.

As described hereinabove the present invention provides a chemical mechanical polishing first-step slurry formulation for removing and polishing the bulk copper layer of a damascene processing step in the manufacturing of an integrated circuit.

At the end of the first step, the bulk copper material layer has been removed exposing the underlying barrier layer. A second-step slurry is useful to remove the barrier layer and to complete the planarization of the wafer surface.

In the second step polishing which is also called a barrier break through step, a high removal rate for barrier (i.e. Ta or TaN) and a high selectivity of barrier to copper and to dielectric is desirable. In a preferred embodiment, the second step slurry formulation achieves removal rates of >1000 Å/min for the barrier material.

The present invention provides a two-step polishing formulation comprising first and second-step slurry compositions, wherein said first-step slurry comprises an organic polymeric abrasive and said second-step slurry comprises an abrasive, and an oxidizing agent, wherein the abrasive component is selected from the group consisting of silica, alumina, ceria and mixtures thereof.

Further, the instant invention relates to a second-step polishing slurry formulation comprising silica as abrasive particles, an oxidizing agent, and a passivating agent. The chemistry of the second-step slurry should be stable and have a pH in the range of about 4 to 10.

Prefereably, the particles of the second step slurry formulation are precipitated silica. The precipitated particles usually range from about 3 to 100 nm in size and can be spherical. An alternative to precipitated silica particles in the second-step slurry is fumed silica. Generally, the fumed silica has a mean particle size of less than 700 nm.

Alternatively, and more preferred is to use colloidal silica particles of the type described. The colloidal silica particles can range from about 3 to 70 nm in size, and can be spherical. Preferentially, when the first and second step slurries employ spherical colloidal particles, the particles should have a narrow size distribution. More specifically, about 99.9% of the spherical colloidal particles should be within about 3 sigma of a mean particle size with negligible particles larger than about 500 nm.

The second step slurry, thus, can employ either precipitated spherical silica particles in the size range of 3 to 100 nm, or fumed silica with mean particle size less than about 700 nm. These particles coupled with an oxidizing agent allow the second-step slurry to achieve high barrier material removal rates and low copper and dielectric removal rates (as shown in Table 1 heretofore). Colloidal silica, with a narrow size distribution, minimizes micro scratch defects and provides superior removal rates on barrier materials, greater than about 1000 Å/min, and low removal rates for copper and barrier. Further, spherical silica abrasives with a mean size of less than about 100 nm provide very good planarization efficiency (See Table 1, hereinabove).

The preferred oxidizing agent for the second step slurry is hydrogen peroxide ($H_2O_2$). Alternatively, the oxidizing agent may be selected from the group consisting of: ferric nitrate ($Fe(NO_3)_3$), potassium iodate ($KIO_3$), potassium permanganate ($KmnO_4$), nitric acid ($HNO_3$), ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$), and urea hydrogen peroxide (($CO(NH_2)_2)H_2O_2$).

Alternatively, the oxidizing agent of the second step slurry may comprise an amine-N-oxide having the formula ($R_1R_2R_3N \rightarrow O$), wherein $R_1R_2R_3$ are independently selected from the group consisting of: H and $C_1$–$C_8$ alkyl. Specific examples of amine-N-oxides include but are not limited to 4-methylmorpholine N-oxide ($C_5H_{11}NO_2$) and pyidine-N-oxide ($C_5H_5NO$).

The passivating agent as used in the second step slurry is defined as any substance which when mixed with the second-step slurry composition, suppresses etching, while permitting a sufficient CMP rate to be obtained. Preferably, the passivating agent in the second step slurry formulation is benzotriazole (referred to hereafter as BTA) or iminodiacetic acid (referred to hereafter as IDA). Other substances useful as passivating agents include but are not limited to: tolytriazole, BTA derivatives, such as BTA carboxylic acids, cystine, haloacetic acids, glucose and dodecyl mercaptan.

The cleaning agent or complexing agent should be a carboxylic acid. More specifically, the carboxylic acid may be chosen from the group of glycine, oxalic acid, malonic acid, succinic acid, nitrilotriacetic acid, and citric acid. Alternatively, the complexing agent may be a dicarboxylic acid that preferentially has a nitrogen containing functional group or an amine. In the most preferred form, the complexing agent for the second-step slurry composition is iminodiacetic acid or ethylenediamine.

The second step-slurry composition may further comprise potassium or ammonium hydroxide or any weak organic base, such as tetramethyl ammonia, tetraethyl ammonia, and amines in such amounts as to adjust the pH to the desired level. Preferebly, the pH of the second-step slurry composition is from about 7.1 to 10 and more preferably, from about 7.9 to 8.8.

In one embodiment, the second step-slurry composition comprises from about 0 to 30 percent oxidizer, about 1 to 10 percent colloidal silica or precipitated silica, about 0.01 to 5 percent complexing agent, and about 0 to 5 percent passivating agent, and water.

In a more preferred embodiment, the second step-slurry composition comprises from about 0 to 15 percent oxidizer, about 5 to 10 percent colloidal silica or precipitated silica, about 0.05 to 1 percent complexing agent, and about 0.02 to 0.1 percent passivating agent, and water.

In the most preferred embodiment, the second-step slurry composition, comprises 0.05 percent ethylenediamine as complexing agent and 5 percent colloidal silica.

Although the present invention is directed to removal of copper, copper containing materials and related barriers, it is not thus limited to such. The present invention is useful for polishing and planarizing materials useful as interconnects and related barriers in semiconductor related applications including but not limited to aluminum, aluminum alloys, aluminum compounds having aluminum as its principal component, tungsten, tungsten alloys, tungsten compounds having tungsten as its principal component, (i.e., tungsten nitride), tantalum, tantalum nitride, silicon doped tantalum nitride, titanium, titanium alloys and titanium compounds having titanium as its principal component (i.e., titanium nitride and silicon doped titanium nitride).

It is further understood that the present invention is not limited to the particular embodiments shown and described herein, but that various changes and modifications may be made without departing from the scope and spirit of the invention.

The features, aspects and advantages of the present invention are further shown with reference to the following non-limiting examples relating to the invention.

EXAMPLES

The pH, oxidizing agents, modifying agents, abrasive particle composition and size distribution, and weight percent were evaluated to establish a baseline for removal rates and selectivity for the second step slurry formulations.

Example 1

Slurry 1 Formulations Showing Static Etch Rate of Copper

Several formulations of the first slurries were prepared. The static etch removal rates of these formulations are described in Table 4. As can be seen from Table 4, the first step slurry formulations of the present invention were effective in achieving acceptable static copper removal rates of 50 A/min.

TABLE 1

Removal Rate Under Static Conditions (SRR). Component Values in Weight Percent

| Slurry | $H_2O_2$ | Citric Acid | IDA | IX-38 | $NH_3$ | pH | SRR | |
|---|---|---|---|---|---|---|---|---|
| 1 | 5 | | 0.2 | | | 2.5 | 300 (2) | |
| 2 | 5 | | 0.1 | | | 2.6 | 237 (2) | |
| 3 | 5 | | | 5 | | 4.1 | 208 (5) | |
| 4 | 5 | 1 | | 5 | | 2 | N/A (5) | |
| 5 | 5 | | 0.2 | 5 | | 2.3 | N/A (5) | |
| 6 | 5 | 1 | 0.2 | | | 2.1 | 1600 (2) | 944 (3) |

TABLE 1-continued

Removal Rate Under Static Conditions (SRR). Component Values in Weight Percent

| Slurry | $H_2O_2$ | Citric Acid | IDA | IX-38 | $NH_3$ | pH | SRR | | | |
|---|---|---|---|---|---|---|---|---|---|---|
| 7 | 5 | 1 | 0.2 | 5 | | 2.2 | N/A (5) | | | |
| 8 | | 0.5 | | 5 | 0.00273 | 3.5 | 1.17 (1) | | | |
| 9 | 5 | 0.5 | | | 0.00523 | 3.5 | 661 (1) | | | |
| 10 | 5 | | 0.2 | | 0.00298 | 3.7 | 150 (1) | 90 (2) | | |
| 11 | 5 | 0.5 | 0.2 | | 0.00891 | 3.5 | 640 (1) | 501 (3) | | |
| 12 | 5 | 0.5 | | 5 | 0.00529 | 3.5 | 793 (1) | | | |
| 13 | 5 | | 0.2 | 5 | 0.003 | 3.6 | 149 (1) | 98 (2) | 70 (5) | |
| 14 | 5 | 0.5 | 0.2 | 5 | 0.00885 | 3.5 | 858 (1) | 627 (2) | 453 (5) | |
| 15 | 10 | 0.5 | 0.2 | 5 | 0.00912 | 3.5 | 1029 (1) | 578 (2) | 468 (5) | 439 (10) |
| 16 | 1 | 0.5 | 0.2 | 5 | 0.00851 | 3.5 | 855 (1) | 666 (2) | 563 (5) | 520 (10) |
| 17 | 5 | 0.25 | 0.5 | 5 | 0.01 | 3.5 | 601 (1) | 488 (2) | 450 (5) | |
| 18 | 5 | 0.25 | 1 | 5 | 0.017 | 3.5 | 836 (1) | 561 (2) | 377 (5) | |
| 19 | 5 | 0.25 | 0.5 | 5 | 0.44 | 3.5 | 960 (1) | 504 (2) | 300 (5) | 298 (10) |
| 20 | 5 | 0.1 | 0.1 | 5 | 0.022 | 3.5 | 260 (1) | 181 (2) | 159 (5) | 199 (1) |
| 21 | 5 | 0.1 | 0.2 | 5 | 0.032 | 3.5 | 424 (1) | 273 (2) | 138 (5) | |
| 22 | 5 | | | 5 | | 4 | | | | |
| 23 | 5 | | 0.2 | 5 | | 2.3 | | | | |
| 24 | 5 | | 0.2 | 5 | 0.027 | 3.5 | | | | |
| 25 | 5 | 0.1 | 0.2 | 5 | 0.013 | 2.5 | 528 (1) | 516 (2) | 323 (5) | |
| 26 | 5 | 0.1 | 0.2 | 5 | 0.028 | 3 | 400 (1) | 285 (2) | | |
| 27 | 5 | 0.1 | 0.2 | 5 | 0.041 | 3.5 | 273 (1) | 178 (2) | | |

The numbers in parentheses indicate the length of soaking time for static etching rate study.

Example 2

Table 3 outlines twelve formulations and polishing conditions for the second step polishing slurry tested on Ta, TaN, Cu and thermal oxide blanket wafers (Table 4). The various formulations comprise between 0 to 13 percent hydrogen peroxide ($H_2O_2$) as oxidizing agent, 0 to 0.05 percent ethylenediamine as complexing agent, 0 to 0.1 percent BTA, or between 0 to 0.2 percent iminodiacetic acid as passivating agent, and between 5 to 10 percent colloidal silica or 5 to 10 percent precipitated silica. The pH of the formulations ranged from 6.8 to 8.8. The polishing conditions ranged from table speed (TS) of 45 to 125 rpm, quill speed (QS) of 42 to 116 rpm, down force (DF) of 3.5 to 4 psi, and a flow rate (FR) of 160 mL/min.

TABLE 4

Removal Rates (Å/min) and Selectives Using Second Step Slurry Compositions Outlined in Table 3.

| Slurry: | Cu | Ta | TaN | PETEOS | Ta:Cu:Oxide | TaN:Cu:oxide |
|---|---|---|---|---|---|---|
| 1 | 116 | 130 | 1167 | 127 | 1:1:1 | 1:0.1:0.1 |
| 2 | 29 | 42 | 35 | N/A | 1:0.69 | 1:0.83 |
| 3 | 1071 | 567 | 622 | 43 | 1:1.89:0.076 | 1:1.72:0.069 |
| 4 | 138 | 562 | 659 | 667 | 1:0.25:1.19 | 1:0.21:1.01 |
| 5 | 812 | 562 | 1082 | 807 | 1:0.69:0.70 | 1:0.75:0.75 |
| 6 | 62 | 28 | 47 | 50 | 1:2.2:1.79 | 1:1.32:1.06 |
| 7 | 123 | 512 | 203 | 195 | 1:0.24:0.38 | 1:0.61:0.96 |
| 8 | 102 | 75 | 121 | 52 | 1:1.4:1.7 | 1:0.85:0.43 |

TABLE 3

Compositions and Polishing Conditions for Second Step Slurry

| Slurry: | $H_2O_2$ | EDA | BTA | IDA | Colloidal Silica | Precipitated Silica | KOH | pH | Polish Conditions TS/QS/DF/FR |
|---|---|---|---|---|---|---|---|---|---|
| 1 | | 0.05 | | | 5 | | | 8.8 | 125/116/4.0/160 |
| 2 | | | | | 5 | | * | 6.8 | 125/116/4.0/160 |
| 3 | 0.5 | 0.05 | | | 5 | | | 6.8 | 45/42/3.5/160 |
| 4 | 13 | | | | | 10 | | 8.1 | 125/116/4.0/160 |
| 5 | 13 | | | 0.2 | | 10 | | 6.8 | 125/116/4.0/160 |
| 6 | 13 | | | | | 10 | * | 6.7 | 45/42/3.5/160 |
| 7 | 13 | | | | | 10 | | 7.9 | 45/42/4.0/160 |
| 8 | 13 | | | | | 5 | | 8 | 45/42/4.0/160 |
| 9 | 13 | | | | | 15 | | 8.1 | 45/42/4.0/160 |
| 10 | 13 | | 0.02 | | | 10 | | 8 | 45/42/4.0/160 |
| 11 | 13 | | 0.005 | | | 10 | | 8 | 45/42/4.0/160 |
| 12 | 0.5 | | 0.1 | | 5 | | * | 8 | 45/42/4.0/160 |

*chemical used to adjust the pH

TABLE 4-continued

Removal Rates (Å/min) and Selectives Using Second Step
Slurry Compositions Outlined in Table 3.

| Slurry: | Cu | Ta | TaN | PETEOS | Ta:Cu:Oxide | TaN:Cu:oxide |
|---|---|---|---|---|---|---|
| 9 | 164 | 432 | 435 | 447 | 1:0.48:1.31 | 1:0.38:1.03 |
| 10 | "1" | 166 | 232 | 172 | 1:0.006:1.04 | 1:0.0043:0.74 |
| 11 | "1" | 162 | 197 | 170 | 1:0.0062:1.05 | 1:0.0051:0.86 |
| 12 | "1" | 60 | 81 | 31 | 1:0.017:0.52 | 1:0.012:0.38 |

As table 4 indicates, a selectivity of TaN:Cu:PETEOS of 10:1:1 was obtained using Slurry 1. When Ta is the barrier material, two useful formulations were discovered. The first one was based on second step formulation, Slurry 7 as listed in this Table, which includes 13 wt % of $H_2O_2$ and 10 wt % of a precipitated silica abrasive. To this slurry, BTA (passivating agent) was added with concentrations of 0.005 wt % (Slurry 11) and 0.02 wt % (Slurry 10). With the modified Slurry 7 formulation, removal rates for Ta, TaN, Cu and PETEOS have all been reduced, with the largest decrease in copper. However, a selectivity of Ta:Cu of 166:1 has been obtained. The Slurry 12 formulation which employed a 5 wt % colloidal silica, 0.5 wt. % $H_2O_2$, 0.1. wt. % BTA with a pH of 8 obtained a Ta:Cu:PETEOS of 60:1:30.

Example 3

Stability Experiment

The poly (methyl methacrylate) colloid of the step one slurry formulation shows outstanding chemical and mechanical stability. The particles did not show any significant changes in terms of particle size and particle size distribution after aging two months, that is, the mean particle size remains about 45 nm and the range of distribution is from about 5 nm to 100 nm.

The first and second slurries described herein, may also be used in a method of chemical mechanical polishing as described above. Also, while this invention has been disclosed and discussed primarily in terms of specific embodiments thereof, it is not intended to be limited theretto. Other modifications and embodiments will be apparent to the skilled worker in the art.

What is claimed is:

1. A chemical mechanical polishing slurry being free of heteropolyacid, said slurry comprising an abrasive and an oxidizing agent selected from the group consisting of hydrogen peroxide, iodic acid, potassium iodate, ferric nitrate, ammonium chlorite, ammonium chlorate, ammonium iodate, ammonium perborate, ammonium perchlorate, ammonium periodate ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, and urea, wherein said abrasive consists essentially of organic polymer.

2. The chemical mechanical polishing slurry according to claim 1, wherein the abrasive consists essentially of poly (methyl methacrylate).

3. The chemical mechanical polishing slurry according to claim 1, wherein the abrasive consists essentially of colloidal poly (methyl methacrylate).

4. The chemical mechanical polishing slurry according to claim 1, wherein said abrasive is present in said slurry in a weight percent ranging from about 1 to 10.

5. The chemical mechanical polishing slurry according to claim 1, wherein said abrasive is present in said slurry in a concentration ranging from about 3 to 8 weight percent.

6. The chemical mechanical polishing slurry according to claim 1, wherein said abrasive is present in said slurry in a concentration of about 5 weight percent.

7. The chemical-mechanical polishing slurry according to claim 1, wherein said abrasive has a particle size distribution in a range of from about 10 to 75 nm.

8. The chemical-mechanical polishing slurry according to claim 1, wherein said abrasive has a particle size distribution in a range of from about 20 to 60 nm.

9. The chemical-mechanical polishing slurry according to claim 1, wherein said abrasive has a particle size distribution in a range of from about 29 to 55 nm.

10. The chemical mechanical polishing slurry according to claim 1, further comprising an oxidizing agent and an activating agent.

11. The chemical mechanical polishing slurry according to claim 1, wherein said slurry comprises from about 1 to 10% by weight abrasive; from about 1 to 20% by weight oxidizing agent and from about 0 to 5% activating agent.

12. The chemical mechanical polishing slurry according to claim 11 further comprising from about 0.1 to 2 percent surfactant.

13. The chemical mechanical polishing slurry according to claim 12, wherein said surfactant is selected from the group consisting of non-ionic, cationic and anionic.

14. The chemical mechanical polishing slurry according to claim 12, wherein said surfactant is anionic.

15. The chemical mechanical polishing slurry according to claim 12, wherein said surfactant is water-soluble.

16. The chemical mechanical polishing slurry according to claim 14, wherein said anionic surfactant is selected from the group consisting of carboxylates, alkyl sulfates and alkyl phosphates.

17. The chemical mechanical polishing slurry according to claim 14, wherein said anionic surfactant is sodium laurel sulfate.

18. The chemical mechanical polishing slurry according to claim 1, further comprising a pH modifier selected from the group consisting of: potassium hydroxide, sodium hydroxide, ammonium hydroxide and tetra methyl ammonium hydroxide wherein said pH modifier is present in an amount sufficient to modify the pH to a region of about 2 to 4.

19. The chemical mechanical polishing slurry according to claim 10, wherein said oxidizing agent is selected from the group consisting of hydrogen peroxide, iodic acid, potassium iodate, and ammonium perborate.

20. The chemical mechanical polishing slurry according to claim 10, wherein said oxidizing agent is hydrogen peroxide.

21. The chemical mechanical polishing slurry according to claim 1, further comprising a passivating agent.

22. The chemical mechanical polishing slurry according to claim 1, further comprising a complexing agent.

23. The chemical mechanical polishing slurry according to claim 1, having a pH in a range of from about 0.1 to 6.9.

24. The chemical mechanical polishing slurry according to claim 1, further comprising an oxidizing agent, an activating agent, a passivating agent and a complexing agent.

25. The chemical mechanical polishing slurry according to claim 1, wherein said slurry comprises from about 1 to 10% by weight abrasive; from about 1 to 20% by weight oxidizing agent; from about 0 to 5% activating agent; from about 0.01 to 2% and from about 0.01 to 3 percent complexing agent.

26. The chemical mechanical polishing slurry according to claim 25, further comprising a pH modifier selected from the group consisting of potassium hydroxide, sodium hydroxide, ammonium hydroxide and tetra methyl ammonium hydroxide wherein such pH modifier is present in an amount sufficient to modify the pH to a region of about 2 to 4.

27. The chemical mechanical polishing slurry according to claim 24, wherein said passivating agent is a carboxylic acid.

28. The chemical mechanical polishing slurry according to claim 24, wherein the passivating agent is selected from the group consisting of glycine, oxalic acid, malonic acid, succinic acid and nitrilotriacetic acid.

29. The chemical mechanical polishing slurry according to claim 24, wherein the passivating agent is a dicarboxylic acid.

30. The chemical mechanical polishing slurry according to claim 29, wherein the dicarboxylic acid has a nitrogen containing functional group.

31. The chemical mechanical polishing slurry according to claim 29, wherein the dicarboxylic acid is iminodiacetic acid.

32. The chemical mechanical polishing slurry according to claim 24, wherein the passivating agent is iminodiacetic acid.

33. The chemical mechanical polishing slurry according to claim 24, wherein the activating agent is selected from the group consisting of inorganic and organic acids.

34. The chemical mechanical polishing slurry according to claim 33, wherein the inorganic acid is selected from the group consisting of phosphoric acid and iodic acid.

35. The chemical mechanical polishing slurry according to claim 33, wherein the organic acid is selected from the group consisting of citric acid and malonic acid.

36. The chemical mechanical polishing slurry according to claim 24, wherein the complexing agent is selected from the group consisting of citric acid and malonic acid.

37. The chemical mechanical polishing slurry according to claim 24, further comprising potassium hydroxide, sodium hydroxide or ammonium hydroxide in such amounts to modify the pH to a region of about 0.1 to 6.9.

38. A chemical mechanical polishing slurry being free of heteropolyacid and consisting essentially of about 5 percent abrasive, about 5 percent hydrogen peroxide, about 0.1 percent citric acid, about 0.2 percent iminodiacetic acid, about 0.013 percent ammonia, and about 90 percent waters, wherein said abrasive consists essentially of poly (methyl methacrylate).

39. The chemical mechanical polishing slurry according to claim 38 having a pH of about 2.5.

40. A chemical mechanical polishing slurry composition consisting essentially of from about 0.1 to 50 percent abrasive, from about 0.1 to 25 percent oxidizing agent; from about 0 to 5 percent activating agent; from about 0 to 3 percent corrosion inhibitor and from about 0 to 3 percent cleaning agent, wherein said abrasive consists essentially of colloidal poly (methyl methacrylate), and wherein said composition is free of heteropolyacid.

* * * * *

UNITED STATES PATENT AND TRADEMARK OFFICE
CERTIFICATE OF CORRECTION

PATENT NO. : 7,029,373 B2
APPLICATION NO. : 09/929564
DATED : April 18, 2006
INVENTOR(S) : Ying Ma et al.

It is certified that error appears in the above-identified patent and that said Letters Patent is hereby corrected as shown below:

Title page, Item (74): "Bultquist" should be --Hultquist--

Column 8, line 39, "agen" should be --agents for the--;

Column 14, line 33, "Selectives" should be --Selectivities--;

Column 15, line 4, "Selectives" should be --Selectivities--;

Column 18, line 16, "waters" should be --water--.

Signed and Sealed this

Seventeenth Day of October, 2006

JON W. DUDAS
*Director of the United States Patent and Trademark Office*